United States Patent
Jizaimaru

(10) Patent No.: US 10,865,130 B2
(45) Date of Patent: Dec. 15, 2020

(54) APPARATUS AND METHOD FOR PRODUCING ALKALINE WATER FOR CLEANING ELECTRONIC DEVICE

(71) Applicant: NOMURA MICRO SCIENCE CO., LTD., Atsugi (JP)

(72) Inventor: Takayuki Jizaimaru, Atsugi (JP)

(73) Assignee: NOMURA MICRO SCIENCE CO., LTD., Atsugi (JP)

(*) Notice: Subject to any disclaimer, the term of this patent is extended or adjusted under 35 U.S.C. 154(b) by 0 days.

(21) Appl. No.: 16/265,031

(22) Filed: Feb. 1, 2019

(65) Prior Publication Data

US 2019/0161371 A1    May 30, 2019

Related U.S. Application Data

(63) Continuation of application No. PCT/JP2017/025209, filed on Jul. 11, 2017.

(30) Foreign Application Priority Data

Aug. 2, 2016 (JP) .................. 2016-152139

(51) Int. Cl.
*B01D 19/00* (2006.01)
*B01D 61/00* (2006.01)
(Continued)

(52) U.S. Cl.
CPC ............ *C02F 9/00* (2013.01); *B01D 19/0031* (2013.01); *B01D 61/00* (2013.01); *B01F 1/00* (2013.01);
(Continued)

(58) Field of Classification Search
CPC ....... B01D 19/0031; B01D 61/00; B01F 1/00; B01F 3/04262; B01F 2003/04404;
(Continued)

(56) References Cited

U.S. PATENT DOCUMENTS 6,290,777 B1    9/2001  Imaoka et al.
2012/0024784 A1* 2/2012 Clark ................. B01D 19/0031
                                                                210/638

FOREIGN PATENT DOCUMENTS

JP    10-64867       3/1998
JP    2000-354729   12/2000
JP    2004-296463   10/2004

OTHER PUBLICATIONS

Machine translation of JP 2004-296463 to Miyamoto et al. (2004) (obtained from Google Patents Feb. 2020) (Year: 2004).*
(Continued)

*Primary Examiner* — Lucas A Stelling
(74) *Attorney, Agent, or Firm* — Oblon, McClelland, Maier & Neustadt, L.L.P.

(57) ABSTRACT

To provide method and apparatus for producing alkaline water, capable of preventing mixture of fine particles derived from a gas dissolving membrane device into hydrogen water. An apparatus for producing alkaline water for cleaning electronic device includes: a pH adjusting device 11 configured to adjust ultrapure water to be alkaline; a deaeration device 13 configured to deaerate the ultrapure water adjusted to be alkaline; and a gas dissolving membrane device 14 having a gas permeable membrane to dissolve functional gas into the deaerated ultrapure water.

10 Claims, 2 Drawing Sheets

(51) Int. Cl.
*B01F 1/00* (2006.01)
*B01F 3/04* (2006.01)
*C02F 1/20* (2006.01)
*C02F 1/66* (2006.01)
*C02F 1/68* (2006.01)
*C02F 1/78* (2006.01)
*C02F 9/00* (2006.01)
*H01L 21/02* (2006.01)
*C02F 103/04* (2006.01)
*C02F 103/34* (2006.01)

(52) U.S. Cl.
CPC ............ *B01F 3/04262* (2013.01); *C02F 1/20* (2013.01); *C02F 1/68* (2013.01); *C02F 1/78* (2013.01); *B01F 2003/04404* (2013.01); *B01F 2003/04914* (2013.01); *C02F 1/66* (2013.01); *C02F 1/685* (2013.01); *C02F 2103/04* (2013.01); *C02F 2103/346* (2013.01); *H01L 21/02052* (2013.01)

(58) Field of Classification Search
CPC .... B01F 2003/04914; C02F 1/20; C02F 1/66; C02F 1/68; C02F 1/685; C02F 1/78; C02F 9/00; C02F 2103/04; C02F 2103/346; H01L 21/02052
See application file for complete search history.

(56) References Cited

OTHER PUBLICATIONS

International Search Report dated Oct. 10, 2017 in PCT/JP2017/025209 filed on Jul. 11, 2017 (with English Translation).
Written Opinion dated Oct. 10, 2017 in PCT/JP2017/025209 filed on Jul. 11, 2017.

\* cited by examiner

APPARATUS AND METHOD FOR PRODUCING ALKALINE WATER FOR CLEANING ELECTRONIC DEVICE

CROSS-REFERENCE TO RELATED APPLICATIONS

This application is a continuation of prior International Application No. PCT/JP2017/025209, filed on Jul. 11, 2017 which is based upon and claims the benefit of priority from Japanese Patent Application No. 2016-152139 filed on Aug. 2, 2016; the entire contents of all of which are incorporated herein by reference.

FIELD

Embodiments described herein generally relate to apparatus and method for producing alkaline water for cleaning electronic device.

BACKGROUND

In a production process of electronic parts and members such as an LSI (large-scale integrated circuit or the like), cleaning of a surface is performed using ultrapure water or cleaning liquid made by dissolving chemicals in ultrapure water. For example, in the case of a silicon wafer, a method of immersing the silicon wafer in ultrapure water or cleaning liquid, or pouring away ultrapure water or cleaning liquid on the silicon wafer is used.

As the cleaning liquid, a mixed solution of sulfuric acid and hydrogen peroxide is used for the purpose of removing an organic substance adhering to the surface, mixed cleaning liquid of ammonia and hydrogen peroxide is used for the purpose of removing fine particles, mixed cleaning liquid of hydrochloric acid and hydrogen peroxide is used for the purpose of removing metal impurities, and hydrofluoric acid cleaning liquid is used for the purpose of removing a natural oxide film on the silicon wafer surface.

Here, from the viewpoints of reducing the quantity of the cleaning liquid, reducing the quantity of ultrapure water for rinse after cleaning, reducing wastewater load and so on, so-called functional water is used as cleaning water in recent years in the production process of LSI in order to remove fine particles on electronic parts and members. The functional water is produced by dissolving specific gas (functional gas) such as hydrogen gas, ozone gas, carbon dioxide gas or the like in ultrapure water using a gas dissolving membrane device.

As the functional water for cleaning, hydrogen water made by dissolving hydrogen gas in ultrapure water is known (refer to, for example, JP-A H10-064867). Besides, it is also suggested to dissolve carbon dioxide gas or ammonia gas in hydrogen water to adjust its specific resistance to a predetermined specific resistance in order to prevent re-adherence of contamination fine particles in cleaning of electronic parts and members (refer to, for example, JP-A 2000-354729).

SUMMARY

Besides, the present inventors have obtained knowledge that fine particles mix into hydrogen water produced using the gas dissolving membrane device that dissolves gas in liquid through a gas permeable membrane. If fine particles mix into hydrogen water and when the hydrogen water is used for cleaning, contamination of an object to be cleaned occurs due to adherence of the fine particles.

Therefore, an object of the present invention is to provide method and apparatus for producing alkaline water for cleaning electronic device, capable of preventing mixture of fine particles derived from a gas dissolving membrane device into alkaline water.

The present inventors have found the occurrence of the fine particles when repeatedly carried out experiments of dissolving hydrogen gas into ultrapure water using a gas dissolving membrane device that dissolves gas in liquid through a gas permeable membrane. At that time, the present inventors have acquired knowledge that fine particles often mixed in hydrogen water produced in a certain period at a stage of an initial period of water passage to the gas dissolving membrane device or at a stage of an initial period of water passage in the case where the device was stopped and then restarted.

The fine particles are considered to be likely to adhere to the gas permeable membrane due to static electricity because the gas permeable membrane is large in surface area and composed of a material likely to accumulate static electricity. From this consideration, the present inventors thought that the reason of the mixture of the fine particles at the initial period of water passage is because a small amount of fine particles existing in the ultrapure water adhere to the surface of the gas permeable membrane provided in the gas dissolving membrane device and accumulate and gradually separate at start or restart of the device and mix into the hydrogen water.

Besides, a monitor such as a hydrogen concentration meter installed in a conventional apparatus for producing functional water for cleaning has caused a problem such as a failure due to flow of high current in rare cases. Though it was known that the cause of this failure was static electricity, but the place of the device where static electricity occurred was not specified. However, the present inventors have presumed, from the above findings, that the static electricity accumulated on the gas permeable membrane is the cause.

The present inventors have carried out further study on the basis of the findings and consequently completed apparatus and method for producing alkaline water for cleaning electronic device of this embodiment including the following configuration. Specifically, an apparatus for producing alkaline water for cleaning electronic device of this embodiment includes: a pH adjusting device configured to adjust the ultrapure water to be alkaline; a deaeration device configured to deaerate the ultrapure water adjusted to be alkaline; and a gas dissolving membrane device configured to dissolve functional gas into the deaerated ultrapure water through a gas permeable membrane.

According to this embodiment, the electric conductivity of the ultrapure water to be supplied to the gas dissolving membrane device and the deaeration device is increased by the pH adjusting device, thus preventing electrification of the pipe and the like of the gas dissolving membrane device. Therefore, the fine particles derived from the gas dissolving membrane device and the deaeration device are quickly discharged at the initial period of preliminary water passage at start of the device, so that alkaline water for cleaning electronic device without mixture of fine particles can be provided.

In the apparatus for producing alkaline water for cleaning electronic device of this embodiment, it is preferable that the pH adjusting device adjusts pH of the ultrapure water to 8 to 11.

In the apparatus for producing alkaline water for cleaning electronic device of this embodiment, it is preferable that the pH adjusting device adds, to the ultrapure water, one or more of alkaline component selected from ammonia, sodium tetramethylammonium hydroxide, 2-hydroxyethyl trimethylammonium hydroxide (choline), sodium hydroxide, and potassium hydroxide.

In the apparatus for producing alkaline water for cleaning electronic device of this embodiment, it is preferable that the pH adjusting device adds the alkaline component in an amount that a concentration thereof in the alkaline water becomes 2 mg/L to 100 mg/L.

In the apparatus for producing alkaline water for cleaning electronic device of this embodiment, it is preferable that the alkaline component is ammonia.

In the apparatus for producing alkaline water for cleaning electronic device of this embodiment, it is preferable that the functional gas is one or more kinds selected from hydrogen gas, ozone gas, and rare gas.

In the apparatus for producing alkaline water for cleaning electronic device of this embodiment, it is preferable that the functional gas is hydrogen gas. Further, it is preferable that a hydrogen gas concentration in the alkaline water is 1.0 mg/L to 1.6 mg/L.

In the apparatus for producing alkaline water for cleaning electronic device of this embodiment, it is preferable that the gas permeable membrane is composed of one or more kinds of material selected from polypropylene (PP) and polyvinylidene fluoride (PVDF).

A method for producing alkaline water for cleaning electronic device of this embodiment includes: a pH adjustment step of adjusting liquidity of ultrapure water to be alkaline; a deaeration step of deaerating the ultrapure water adjusted to be alkaline at the pH adjustment step; and a dissolution step of dissolving functional gas into the ultrapure water deaerated at the deaeration step through a gas permeable membrane.

According to the apparatus and method for producing alkaline water for cleaning electronic device of this embodiment, it is possible to prevent mixture of fine particles derived from a gas dissolving membrane device and a membrane deaeration device into alkaline water.

DETAILED DESCRIPTION

Figure 1:
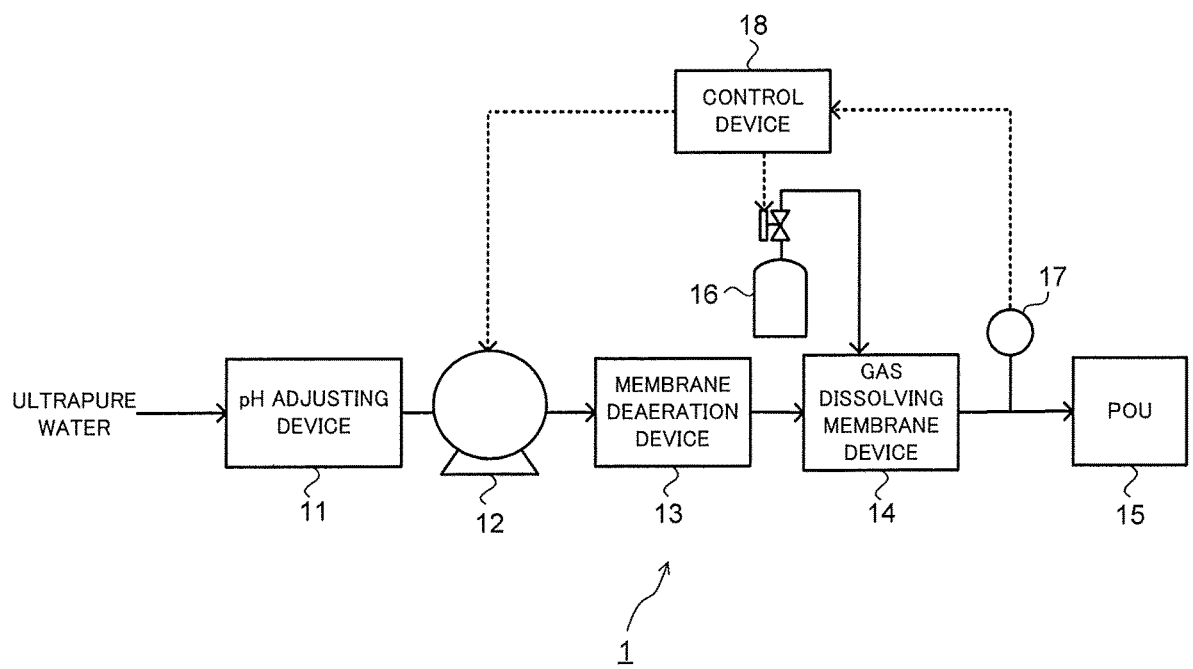
FIG. 1 is a block diagram schematically illustrating an apparatus for producing alkaline water for cleaning electronic device in an embodiment.

Hereinafter, embodiments will be described in detail referring to the drawings. FIG. 1 is a block diagram schematically illustrating an apparatus 1 for producing alkaline water for cleaning electronic device in this embodiment. The apparatus 1 for producing alkaline water illustrated in FIG. 1 includes a pH adjusting device 11 that adjusts the liquidity of ultrapure water to be alkaline, a feed water pump 12 that pressurizes the ultrapure water, a membrane deaeration device 13 that deaerates the pressurized ultrapure water, and a gas dissolving membrane device 14 that dissolves functional gas into the deaerated alkaline ultrapure water to generate functional water. The apparatus 1 for producing alkaline water further includes a functional gas supply device 16 that supplies the functional gas to the gas dissolving membrane device 14, and a water pressure sensor 17 that measures the water pressure of the functional water flowing out of the gas dissolving membrane device 14. The alkaline water for cleaning electronic device produced in the apparatus 1 for producing alkaline water is sent to its use place (point of use: POU) 15. The feed water pump 12 is not essential but is installed as needed.

The functional gas is gas that imparts a specific function to the ultrapure water and is, for example, hydrogen gas, ozone gas, rare gas, or the like.

A flow path of the apparatus 1 for producing alkaline water is composed of a pipe and a tube. The flow path is provided with a tank, a pump, a joint, a valve, and other facilities as necessary. The material constituting the flow path of the apparatus 1 for producing alkaline water is a material with less elution of chemical substances into liquid and is, for example, a polymeric material such as polyvinyl chloride (PVC), polyphenylene sulfide (PPS), polyvinylidene fluoride (PVDF), tetrafluoroethylene-perfluoroalkylvinyl ether copolymer (PFA), polypropylene (PP) or the like, fiber reinforced plastic (FRP), stainless steel, or the like. Besides, the pipe constituting the flow path has an inner diameter of, for example, about 4 mm to 146 mm.

The polymeric material such as fluorocarbon resin among the above materials is very high in insulation property, and is as high as $10^{12}$ MΩ·cm or more in PFA. On the other hand, the ultrapure water used the production of the alkaline water for cleaning electronic device has a resistivity of preferably 10 MΩ·cm or more, and more preferably 18 MΩ·cm or more.

When the ultrapure water having such a high resistivity flows through the pipe made of the above high-insulating material, static electricity occurs and the pipe material and the ultrapure water take charge. Particularly, in the case where the flow velocity of the ultrapure water is high or the case where gas-liquid mixing is performed in the pipe, static electricity is likely to occur and the electric charge quantity is likely to increase. If the pipe material and the ultrapure water take charge, fine particles are more likely to adhere to and stay at a pipe inner wall surface and the like. When the adhering and staying fine particles are mixed into the liquid due to some sort of impact to contaminate cleaning water, the fine particles are made to adhere to a cleaning object. Besides, when static electricity accumulates and the electric charge quantity becomes very large, sensors such as a resistivity meter, a dissolved hydrogen concentration meter, a pH meter and so on disposed according to the necessity in the apparatus may be broken.

Hence, in the apparatus 1 for producing alkaline water for cleaning electronic device in this embodiment, the above-described configuration dissolves the functional gas after the ultrapure water is adjusted to be alkaline. This imparts the conductivity to the ultrapure water to suppress electrification of the pipe material and the ultrapure water, thereby making the fine particles less likely to adhere to the pipe material. As a result, the fine particles can be discharged to the outside of the apparatus quickly at preliminary water passage when starting the apparatus. Further, also when a small amount of fine particles are mixed into the liquid, the fine particles are not deposited on a gas permeable membrane but are quickly discharged, so that the alkaline water for cleaning electronic device reduced in fine particle concentration to a predetermined value or lower can be stably obtained. Furthermore, in the apparatus 1 for producing alkaline water for cleaning electronic device in this embodiment, the electrification of the pipe material and the ultrapure water is suppressed, thereby making it possible to suppress a failure of a sensor and so on installed at the stage subsequent to the gas dissolving membrane device.

The ultrapure water is produced by removing ionic substance, organic substance, dissolved gas, fine particles and so on from raw water such as tap water, well water, river water, or industrial water. The ultrapure water is produced by an ultrapure water production system including a pre-treatment unit, a primary pure water production unit, and a secondary pure water production unit. The pre-treatment unit includes an aggregation and filtration device, an activated carbon device and so on, and removes a turbid matter in the raw water to produce pre-treated water. The primary pure water production unit is composed to include a reverse osmosis membrane device, an ion exchange device, a deaeration device, an ultraviolet oxidation device and so on, and removes an ionic substance and a nonionic substance in the pre-treated water to produce primary pure water.

The ultrapure water production system may include a primary pure water tank storing the primary pure water. In this case, the secondary pure water production unit is arranged on the downstream side of the primary pure water tank. The secondary pure water production unit includes a heat exchanger, an ultraviolet oxidation device, a nonreproducing type mixed bed ion-exchange device, a membrane deaeration device, and an ultrafiltration device, and removes a small amount of impurities remaining in the primary pure water to produce the ultrapure water.

The pH adjusting device 11 adds a pH regulator to the ultrapure water to adjust the pH of the ultrapure water to be alkaline, thereby producing the alkaline water. The pH adjusting device 11 includes, for example, a tank that stores the alkaline pH regulator and a metering pump that supplies the pH regulator, and automatically measures and supplies the pH regulator from the tank into the pipe through which the ultrapure water passes. Further, the pH adjusting device 11 may suck, like an ejector or the like, the pH regulator out of the tank storing the pH regulator or the like by force of high-pressure fluid, and supply the pH regulator into the pipe. Further, the pH adjusting device 11 may be a device including a pH adjusting bath that stores the ultrapure water therein, a metering pump that supplies the pH regulator to the pH adjusting bath, and so on.

The pH adjusting device 11 adjusts the pH of the alkaline water to preferably 8 to 11, and more preferably 9.5 to 10.5. When the pH is less than 8, static electricity is more likely to occur in the device on the downstream side. When the pH exceeds 11, a surface to be cleaned of the cleaning object may be corroded, and the membranes and so on provided in the membrane deaeration device 13 and the gas dissolving membrane device 14 on the downstream side may be deteriorated.

As the pH regulator, for example, a solution of alkaline compound (alkaline component) such as ammonia, tetramethylammonium hydroxide (TMAH), 2-hydroxyethyl trimethylammonium hydroxide (choline, $(CH_3)_3N^+ CH_2CH_2OH \cdot OH^-$), sodium hydroxide, potassium hydroxide is used. Besides, the pH regulator may be a gaseous alkaline compound such as ammonia gas. Among them, the ammonia water and the ammonia gas are preferably used because a metal ion or an organic ion as a counterion of a hydroxide ion ($OH^-$) does not exist therein to make the impurities not adhere to electronic members and parts being the cleaning objects.

In the case of using ammonia as the pH regulator, the ammonia concentration in the ammonia water is preferably 2 mg/L to 100 mg/L.

The feed water pump 12 pressurizes the ammonia water to a predetermined water pressure by the pH adjusting device 11. The feed water pump 12 is preferably a pump capable of controlling the amount of pressure.

The feed water pump 12 is, but not limited to, a rotary positive displacement pump that successively performs suction and discharge by change in volume, a reciprocating positive displacement pump that repeatedly performs suction and discharge by change in volume, a centrifugal pump that discharges liquid by the centrifugal force or propulsive force generated by rotation of an impeller or propeller in the pump, or the like.

More specifically, examples of the rotary positive displacement pump include a tube pump, a rotary pump, a gear pump, a snake pump and the like. Examples of the reciprocating positive displacement pump include a diaphragm pump, a plunger pump and the like. Besides, examples of the centrifugal pump include a volute pump and the like. The rotary positive displacement pump and the centrifugal pump among them are preferable in the point that they cause less pulsation of fluid and keep the discharge pressure almost constant, and the volute pump being the centrifugal pump is particularly preferable.

The discharge pressure of the ultrapure water by the feed water pump 12 is preferably 0.2 MPa to 0.4 MPa. This is because when the discharge pressure by the feed water pump 12 is 0.2 MPa or more, a sufficient flow rate of the ultrapure water is obtained, and the pH regulator added in the pH adjusting device 11 and the ultrapure water are easily sufficiently mixed together. When the discharge pressure of the ultrapure water by the feed water pump 12 is 0.4 MPa or less, static electricity is difficult to occur in the feed water pump.

The membrane deaeration device 13 removes the dissolved gas such as dissolved oxygen, dissolved nitrogen and so on in the alkaline water in order to increase the solubility of the functional gas in the gas dissolving membrane device 14. The membrane deaeration device 13 decreases the concentration of the dissolved oxygen in the ultrapure water supplied to the gas dissolving membrane device 14, for example, to about 0.1 mg/L or less.

As the membrane deaeration device 13, a membrane deaeration device including a gas permeable membrane is preferably used. The material of the gas permeable membrane included in the membrane deaeration device 13 is, for example, a polymeric material such as polypropylene (PP), polyvinylidene fluoride (PVDF) or the like. In the apparatus for producing alkaline water for cleaning electronic device of this embodiment, the pH adjusting device 11 is provided on the upstream side of the membrane deaeration device 13 to adjust the ultrapure water to be alkaline, thereby enabling suppression of occurrence of static electricity also in the case of using the membrane deaeration device 13 and suppression of deposition of fine particles on the gas permeable membrane. Thus, it is possible to suppress mixture of the fine particles into the alkaline water. Note that the membrane deaeration device 13 will be described as an example of the deaeration device in this embodiment, but is not limited to this.

The gas dissolving membrane device 14 is a device that injects and dissolves the functional gas supplied from the functional gas supply device 16 into the liquid through the gas permeable membrane. The gas permeable membrane is a membrane that does not allow water to permeate but allows only gas to permeate. The material of the gas permeable membrane is polypropylene (PP), polyvinylidene fluoride (PVDF), or the like.

The functional gas supply device 16 is composed to include, for example, a mass flow controller that regulates the supply flow rate of the functional gas, in a functional gas storage device that generates or stores the functional gas.

The water pressure sensor 17 measures the water pressure of the alkaline water (functional gas-dissolved alkaline water) flowing out of the gas dissolving membrane device 14. As the water pressure sensor 17, a general diaphragm gauge type water pressure sensor can be used without any particular limitation. As a commercial product of the water pressure sensor 17, for example, a pressure gauge manufactured by Surpass Industry Co., Ltd. or the like can be used. The water pressure sensor 17 outputs a measured value of the water pressure, and the output is inputted into a control device 18.

The control device 18 controls the discharge pressure of the feed water pump 12, based on the output (measured value) of the water pressure sensor 17. Specifically, in the case of using the centrifugal pump such as a volute pump, the control device 18 feeds back a water pressure detection signal from the water pressure sensor 17, compares it with a target water pressure value, and controls the operation frequency of the feed water pump 12 so that the deviation of the detected water pressure value from the target water pressure value becomes zero.

Further, the control device 18 controls the supply flow rate of the functional gas supplied from the functional gas supply device 16. For example, based on the measured value of the water pressure sensor 17, the control device 18 controls the supply flow rate of the functional gas by the mass flow controller provided in the functional gas supply device 16. Thus, the alkaline water containing the functional gas at a predetermined concentration is produced.

Figure 2:
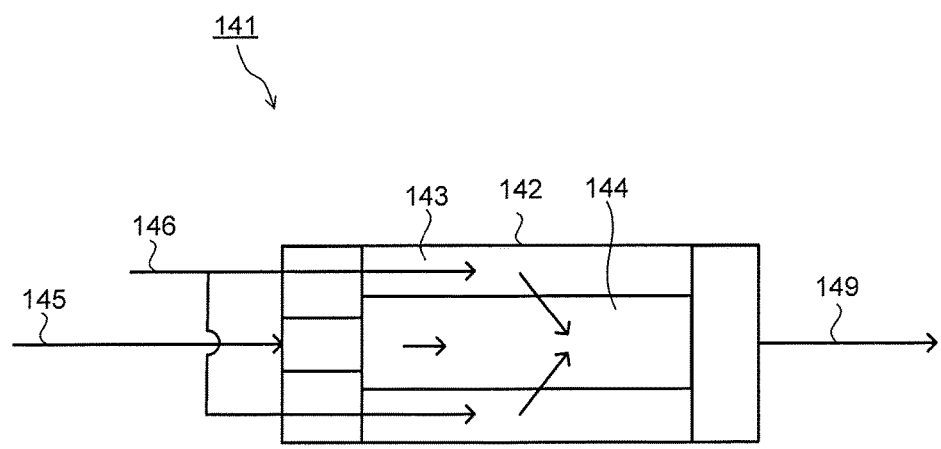
FIG. 2 is a block diagram schematically illustrates a gas dissolving membrane device in the embodiment.

FIG. 2 schematically illustrates a gas dissolving membrane device 141 that injects and dissolves hydrogen gas as the functional gas into the ultrapure water through a gas permeable membrane using a hollow fiber membrane, as one example of the gas dissolving membrane device 14. The gas dissolving membrane device 141 is a device that dissolves the hydrogen gas into the ultrapure water through the hollow fiber membrane as the gas permeable membrane.

The gas dissolving membrane device 141 includes a hollow fiber membrane dissolver 142 (hollow fiber membrane unit) in which the hollow fiber membrane is installed. To the inside of the hollow fiber membrane dissolver 142, an ultrapure water supply pipe 146 is connected which supplies the ultrapure water to the hollow fiber membrane dissolver 142. The ultrapure water is supplied to an outside 143 of the hollow fiber membrane through the ultrapure water supply pipe 146. Meanwhile, the hydrogen gas passes through a gas supply pipe 145 connected to the hollow fiber membrane dissolver 142, and is supplied to an inside 144 of the hollow fiber membrane, at a pressure lower than an outside supply pressure. Thus, the ultrapure water on the outside permeates the hollow fiber membrane and the hydrogen gas dissolves in the ultrapure water permeated the hollow fiber membrane, whereby the hydrogen water is prepared. Note that the supply places of the ultrapure water and the hydrogen gas are not limited to the above, but the ultrapure water may be supplied to the inside 144 of the hollow fiber membrane and the hydrogen gas may be supplied to the outside 143 of the hollow fiber membrane.

To a water outflow port of the hollow fiber membrane dissolver 142, a water outlet pipe 149 is connected, and the ultrapure water with the dissolved hydrogen gas is discharged to the outside of the hollow fiber membrane dissolver 142 via the water outlet pipe 149. By the gas dissolving membrane device 141, the ultrapure water flowing into the hollow fiber membrane dissolver and the supplied functional gas stay for a fixed time at a liquid phase part and a gas phase part of the hollow fiber membrane dissolver respectively, and therefore exhibit buffer functions with respect to fluctuation in supply amount of the hydrogen gas and to slight temporal delay, so that it is possible to stably produce the hydrogen gas-dissolved alkaline water with less fluctuation in concentration of the dissolved hydrogen gas.

Figure 3:
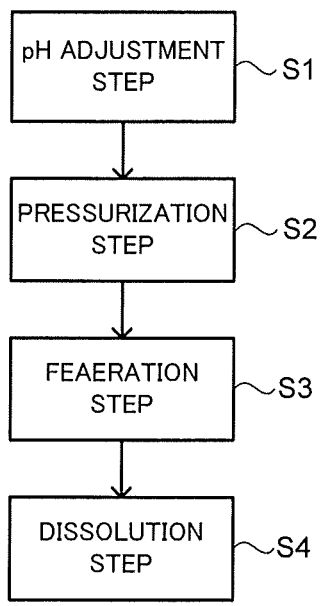
FIG. 3 is a flowchart schematically illustrating an method for producing alkaline water for cleaning electronic device in the embodiment.

FIG. 3 is a block diagram schematically illustrating a method for producing alkaline water for cleaning electronic device in this embodiment using the apparatus 1 for producing alkaline water for cleaning electronic device. The method in this embodiment includes a pH adjustment step S1 of adjusting the liquidity of ultrapure water to be alkaline, a pressurization step S2 of pressurizing the ultrapure water adjusted to be alkaline, a deaeration step S3 of deaerating the pressurized ultrapure water, and a dissolution step S4 of dissolving functional gas into the deaerated ultrapure water. The pressurization step S2 is not essential but is performed as needed.

According to the above-described apparatus and method for producing alkaline water for cleaning electronic device of this embodiment, the pH adjusting device 11 adds the alkaline pH regulator to the ultrapure water to adjust the pH of the ultrapure water to be alkaline on the upstream side of the gas dissolving membrane device 14 to thereby supply the alkaline water having conductivity to the gas dissolving membrane device 14. Therefore, the occurrence of static electricity in the gas dissolving membrane device 14 can be suppressed. This can suppress stay of the fine particles in the gas dissolving membrane device 14 and suppress mixture of the fine particles into the alkaline water.

The functional gas-dissolved alkaline water thus produced is supplied to a cleaning device for electronic devices (electronic parts and members). As the cleaning device, for example, a cleaning device that cleans an object to be cleaned by immersing it in the functional gas-dissolved alkaline water in a cleaning bath, a device that cleans an object to be cleaned by jetting in a shower form and pouring away the functional gas-dissolved alkaline water on the object to be cleaned, or the like is used.

The functional gas-dissolved alkaline water used for the electronic device cleaning may be heated to 20° C. to 60° C. by a heater or the like. Besides, in cleaning of the electronic devices, an ultrasonic wave may be applied to the functional gas-dissolved alkaline water. In this case, there is a method of applying an ultrasonic wave to the functional gas-dissolved alkaline water in which the object to be cleaned is immersed in a cleaning bath, or application of an ultrasonic wave to the functional gas-dissolved alkaline water on the upstream side of a nozzle or the like for jetting the functional gas-dissolved alkaline water.

The alkaline water for cleaning electronic device produced by the apparatus for producing alkaline water for cleaning electronic device of this embodiment is prevented from mixture of fine particles, and therefore can improve the yields of products in cleaning of the electronic parts and members.

Further, even in the case where ON/OFF of the gas dissolving membrane device and the membrane deaeration device is repeated in accordance with the need of the cleaning water in electronic device cleaning, the functional gas-dissolved alkaline water without mixture of fine particles can be supplied at the time of restart of the device.

Besides, when fine particles adhere to the gas dissolving membrane, the gas dissolving membrane is more likely to detach when the flow rates of the ultrapure water and the functional water in the gas dissolving membrane device are changed. According to the method and apparatus for producing alkaline water of this embodiment, however, it is possible to supply the functional gas-dissolved alkaline water without mixture of fine particles even in the case of changing the production flow rate of the functional gas-dissolved alkaline water in the gas dissolving membrane device.

EXAMPLES

Next, examples of the present invention will be described. The present invention is not limited to the following examples.

Example 1

A apparatus for producing alkaline water for cleaning electronic device similar to that in FIG. 1 was used to dissolve ammonia and hydrogen gas into ultrapure water to obtain hydrogen gas-dissolved alkaline water.

Ammonia water (an ammonia concentration of 30 mass %) was added as in the following manner to ultrapure water supplied from an ultrapure water production system. The ultrapure water production system includes an ultrafiltration device (manufactured by ASAHI KASEI CORPORATION, OLT-6036, 6 inches) at its end. A molecular cutoff of the ultrafiltration device is 6000, and the number of average fine particles (particles of 0.05 μm or more) in the ultrapure water filtrated by the ultrafiltration device is 20 to 30 pcs./mL at an initial period of water passage to the ultrafiltration device and is 1 pcs./mL or less at a stable time after water passage for one week. For production of the alkaline water for cleaning electronic device, the ultrapure water after stabilization of the number of fine particles was used (the resistivity of the ultrapure water was 18 MΩ or more and the TOC concentration was 1 μgC/L or less).

Ammonia water was added to the ultrapure water to obtain alkaline water having an ammonia concentration of 100 mg/L. The feed water pump pressurized the ammonia water to 0.25 MPa to supply it to a deaeration device (a hollow fiber membrane dissolving device, Model G284, manufactured by Membrana GmbH, material of the gas permeable membrane: PP) at a flow rate of 20 L/min to obtain deaerated water. The deaerated water was supplied to a gas dissolving membrane device (a hollow fiber membrane dissolving device, Model G284, manufactured by Membrana GmbH, material of the gas permeable membrane: PP) at a flow rate of 20 L/min to produce alkaline water with hydrogen gas dissolved therein (hydrogen gas-dissolved alkaline water). The hydrogen concentration in the hydrogen gas-dissolved alkaline water is 1.2 mg/L. Further, the supply flow rate of the hydrogen gas to the gas dissolving membrane device is 290 mL/min (25° C., 1 atm). The pH of the obtained hydrogen gas-dissolved alkaline water was 10.5, and the ammonia concentration was 100 mg/L.

In the apparatus for producing alkaline water for cleaning electronic device, as the pipe connecting the devices, a pipe made of tetrafluoroethylene-perfluoroalkylvinyl ether copolymer (PFA) having a 1-inch size (an outer diameter of about 25 mm, an inner diameter of about 22 mm) was used.

The electric charge quantity of the hydrogen gas-dissolved alkaline water flowed out of the gas dissolving membrane device in the above was measured by a surface potential measuring device (manufactured by Kasuga Electric Works Ltd., KSD-3000). Further, the number of fine particles of 0.05 μm or more in the hydrogen gas-dissolved alkaline water was continuously measured. Thus, the number of days from when starting the production of the hydrogen gas-dissolved alkaline water (initial period of water passage) after preliminary water passage to the gas dissolving membrane device until when the number of fine particles in the hydrogen gas-dissolved alkaline water became 1 pcs./mL or less was measured. The result is listed in Table 1. Note that in this example, a particle counter UDI-50 manufactured by PARTICLE MEASURING SYSTEMS was used for measuring the number of fine particles.

Example 2

Hydrogen gas-dissolved alkaline water was produced as in Example 1 except that ammonia water was added so that the ammonia concentration in the liquid became 20 mg/L in Example 1, and its electric charge quantity and the number of days from the initial period of water passage to the gas dissolving membrane device until when the number of fine particles in the hydrogen gas-dissolved alkaline water became 1 pcs./mL or less were measured. The results are listed in Table 1.

Example 3

Hydrogen gas-dissolved alkaline water was produced as in Example 1 except that ammonia water was added so that the ammonia concentration in the liquid became 2 mg/L in Example 1, and its electric charge quantity and the number of days from the initial period of water passage to the gas dissolving membrane device until when the number of fine particles in the hydrogen gas-dissolved alkaline water became 1 pcs./mL or less were measured. The results are listed in Table 1.

Comparative Example 1

Hydrogen water was produced as in Example 1 except that hydrogen gas was dissolved in ultrapure water with no ammonia added thereto, and its electric charge quantity and the number of days from the initial period of water passage to the gas dissolving membrane device until when the number of fine particles in the hydrogen water became 1 pcs./mL or less were measured. The results are listed in Table 1.

Comparative Example 2

Hydrogen gas-dissolved alkaline water was produced under the same conditions as those in Example 1 except that an apparatus having the pH adjusting device 11 arranged at the stage subsequent to the gas dissolving membrane device 14 in the apparatus 1 for producing alkaline water for cleaning electronic device in FIG. 1 was used and ammonia water was dissolved at the same concentration as in Example 1 in the ultrapure water with the dissolved hydrogen gas. The electric charge quantity of the hydrogen gas-dissolved alkaline water and the number of days from the initial period of water passage to the gas dissolving membrane device until when the number of fine particles in the hydrogen gas-dissolved alkaline water became 1 pcs./mL or less in this case were measured. The results are listed in Table 1.

TABLE 1

| | Hydrogen Gas-Dissolved Alkaline Water | | | | | |
|---|---|---|---|---|---|---|
| | Hydrogen Gas Concentration (mg/L) | Ammonia Concentration (mg/L) | pH | Conductivity (μS/cm) | Electric Charge Quantity (kV) | Number of Days until Number of Fine Particles Becomes 1 pcs./mL or less |
| Example 1 | 1.2 | 100 | 10.5 | 90 | <−0.1 | <1 |
| Example 2 | 1.2 | 20 | 10.2 | 40 | −0.1 | 1 |
| Example 3 | 1.2 | 2 | 9.6 | 10 | −2.0 | 2 |
| Comp. Exam. 1 | 1.2 | 0 | 7 | <0.05 | −4.0 | 7 |
| Comp. Exam. 2 | 1.2 | 100 | 10.5 | 90 | <−0.1 | 7 |

Figure 4:
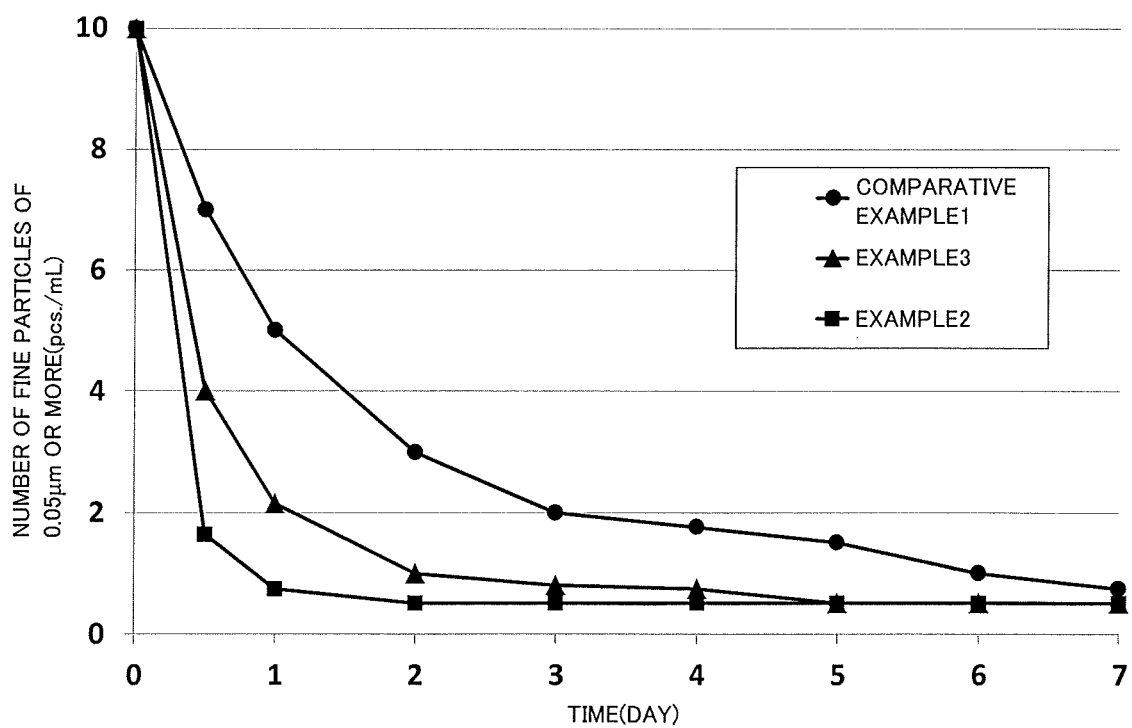
FIG. 4 is a graph representing the relation between a lapse time from an initial period of water passage to the apparatus for producing alkaline water for cleaning electronic device and the number of fine particles in Examples and Comparative Example.

Further, the relation between the lapse time from the initial period of water passage and the number of fine particles in Examples 2, 3 and Comparative Example 1 are illustrated by a graph in FIG. 4.

It is found from Table 1 and FIG. 4 that mixture of fine particles into the hydrogen gas-dissolved alkaline water was suppressed by the apparatus and method for producing alkaline water for cleaning electronic device of this embodiment.

What is claimed is:

1. An apparatus for producing alkaline water for cleaning electronic device, the apparatus comprising:
   a pH adjusting device to add a pH regulator into ultrapure water to keep the ultrapure water alkaline;
   a feed water pump to feed the ultrapure water kept alkaline at a discharge pressure 0.2 MPa to 0.4 MPa;
   a deaerator to deaerate the ultrapure water fed from the feed water pump; and
   a gas dissolver having a gas permeable membrane to dissolve functional gas into the deaerated ultrapure water.

2. The apparatus for producing alkaline water for cleaning electronic device according to claim 1, wherein the pH adjusting device adjusts pH of the ultrapure water at 8 to 11.

3. The apparatus for producing alkaline water for cleaning electronic device according to claim 1, wherein the pH adjusting device adds, to the ultrapure water, at least one alkaline component selected from the group consisting of ammonia, sodium tetramethylammonium hydroxide, 2-hydroxyethyl trimethylammonium hydroxide (choline), sodium hydroxide, and potassium hydroxide.

4. The apparatus for producing alkaline water for cleaning electronic device according to claim 3, wherein the alkaline component is ammonia.

5. The apparatus for producing alkaline water for cleaning electronic device according to claim 3, wherein the pH adjusting device adds, to the ultrapure water, the alkaline component in an amount that a concentration thereof in the alkaline water becomes 2 mg/L to 100 mg/L.

6. The apparatus for producing alkaline water for cleaning electronic device according to claim 1, wherein the functional gas is at least one selected from the group consisting of hydrogen gas, ozone gas, and noble gas.

7. The apparatus for producing alkaline water for cleaning electronic device according to claim 6, wherein the functional gas is hydrogen gas.

8. The apparatus for producing alkaline water for cleaning electronic device according to claim 7, wherein a hydrogen gas concentration in the alkaline water is 1.0 mg/L to 1.6 mg/L.

9. The apparatus for producing alkaline water for cleaning electronic device according to claim 1, wherein the gas permeable membrane comprises at least one material selected from the group consisting of polypropylene and polyvinylidene fluoride.

10. A method for producing alkaline water for cleaning electronic device, the method comprising:
    adjusting a pH of ultrapure water to keep the ultrapure water alkaline;
    feeding the alkaline ultrapure water at a discharge pressure 0.2 MPa to 0.4 MPa by a feed water pump;
    deaerating the alkaline ultrapure water fed by the feed water pump; and
    dissolving functional gas into the deaerated alkaline ultrapure water.

* * * * *